(12) United States Patent
Hulub et al.

(10) Patent No.: US 10,135,240 B2
(45) Date of Patent: Nov. 20, 2018

(54) STACKED SWITCH CIRCUIT HAVING SHOOT THROUGH CURRENT PROTECTION

(71) Applicant: Intel IP Corporation, Santa Clara, CA (US)

(72) Inventors: Marian Hulub, München (DE); Marcin Daniel, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/193,710

(22) Filed: Jun. 27, 2016

(65) Prior Publication Data

US 2017/0373495 A1    Dec. 28, 2017

(51) Int. Cl.
| | | |
|---|---|---|
| H02J 1/00 | (2006.01) |
| H03K 17/08 | (2006.01) |
| H03K 3/356 | (2006.01) |
| H02M 3/335 | (2006.01) |
| H03K 17/10 | (2006.01) |
| H02M 3/158 | (2006.01) |
| H02H 11/00 | (2006.01) |
| G06F 1/28 | (2006.01) |

(52) U.S. Cl.
CPC ............. *H02H 11/007* (2013.01); *G06F 1/28* (2013.01)

(58) Field of Classification Search
CPC .......... H02H 11/007; G06F 1/28; H03K 5/14; H03K 17/10; H02J 1/00; G05F 5/00; G05F 1/613; G11C 5/14
USPC ................................................. 327/365–508
See application file for complete search history.

(56) References Cited

U.S. PATENT DOCUMENTS

| | | | |
|---|---|---|---|
| 6,605,987 B2 | 8/2003 | Eberlein | |
| 7,075,803 B2 | 7/2006 | Eberlein | |
| 7,119,605 B2 | 10/2006 | Eberlein | |
| 7,202,694 B2 | 4/2007 | Eberlein | |
| 7,236,015 B2 | 6/2007 | Eberlein | |
| 8,710,903 B2* | 4/2014 | Oraw | G11C 5/147 327/337 |
| 9,761,284 B1 | 9/2017 | Hulub et al. | |
| 9,816,871 B2 | 11/2017 | Eberlein | |
| 2004/0130307 A1 | 7/2004 | Dequina et al. | |
| 2005/0258889 A1 | 11/2005 | Tolle et al. | |
| 2006/0001176 A1* | 1/2006 | Fukaishi | G11C 5/02 257/777 |
| 2011/0148200 A1* | 6/2011 | Burns | H02M 1/32 307/43 |
| 2011/0298527 A1 | 12/2011 | Lloyd et al. | |

(Continued)

FOREIGN PATENT DOCUMENTS

DE        102012002615        2/2013

OTHER PUBLICATIONS

International Search Report and Written Opinion for PCT Patent Application No. PCT/US2017/029172, dated Jun. 30, 2017, 11 pages.

*Primary Examiner* — Brandon S Cole
(74) *Attorney, Agent, or Firm* — Compass IP Law PC

(57) ABSTRACT

An apparatus is described. The apparatus includes a stacked switch circuit having protection circuitry to prevent shoot through current when the switch is in an off state and respective voltages at the terminals of the switch change such that before the change one of the terminals of the switch has the higher voltage and after the change the other terminal of the switch has the higher voltage.

18 Claims, 5 Drawing Sheets

(56) References Cited

U.S. PATENT DOCUMENTS

| | | | |
|---|---|---|---|
| 2012/0032657 A1 | 2/2012 | Dequina et al. | |
| 2012/0068731 A1 | 3/2012 | Lee et al. | |
| 2012/0262954 A1* | 10/2012 | Duvnjak | H02M 1/4258 363/21.02 |
| 2012/0326680 A1* | 12/2012 | Burns | H02M 3/1588 323/224 |
| 2013/0002149 A1* | 1/2013 | Mott | H02M 1/088 315/161 |
| 2013/0156029 A1* | 6/2013 | Gallatin | H04L 12/4645 370/389 |
| 2014/0266116 A1 | 9/2014 | Henzler et al. | |
| 2014/0266139 A1 | 9/2014 | Eberlein | |
| 2014/0269834 A1 | 9/2014 | Eberlein | |
| 2015/0035586 A1* | 2/2015 | Weis | H03K 17/687 327/436 |
| 2015/0288359 A1* | 10/2015 | Bakalski | H03K 17/693 307/113 |
| 2016/0026198 A1 | 1/2016 | Eberlein | |
| 2016/0116925 A1* | 4/2016 | Freeman | H02M 3/33546 307/130 |
| 2016/0134198 A1* | 5/2016 | Freeman | H02M 3/33546 363/21.05 |
| 2016/0138978 A1 | 5/2016 | Eberlein | |
| 2016/0261262 A1* | 9/2016 | Aubain | H03K 17/162 |
| 2016/0277012 A1* | 9/2016 | Abesingha | H03K 5/14 |
| 2016/0373106 A1* | 12/2016 | Shah | H01L 27/0207 |

* cited by examiner

STACKED SWITCH CIRCUIT HAVING SHOOT THROUGH CURRENT PROTECTION

FIELD OF INVENTION

The field of invention pertains generally to the semiconductor arts, and, more specifically, to a stacked switch circuit having shoot through current protection

BACKGROUND

Circuit designers are continually improving the robustness of their circuits. In the case of analog or mixed signal circuits, often times, a certain externally applied condition can cause the circuit to "glitch". In response, the responsible circuit designs will modify the original circuit to directly address the externally applied condition so as to remove the glitch from the circuit's operation.

FIGURES

A better understanding of the present invention can be obtained from the following detailed description in conjunction with the following drawings, in which.

Figure 3A:
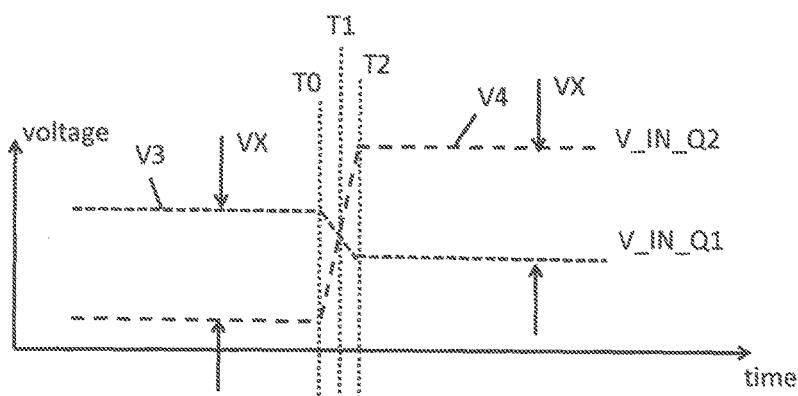
Figure 3B:
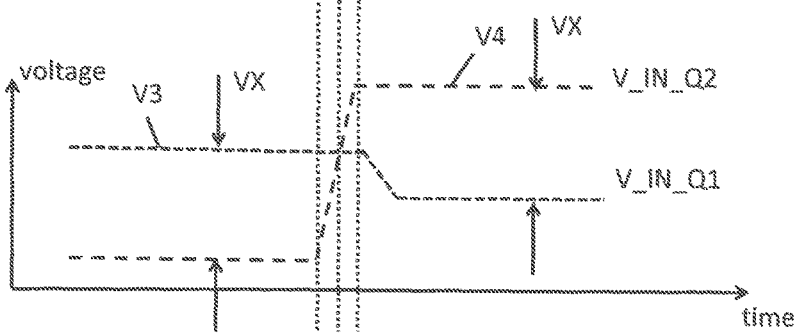
Figure 4:
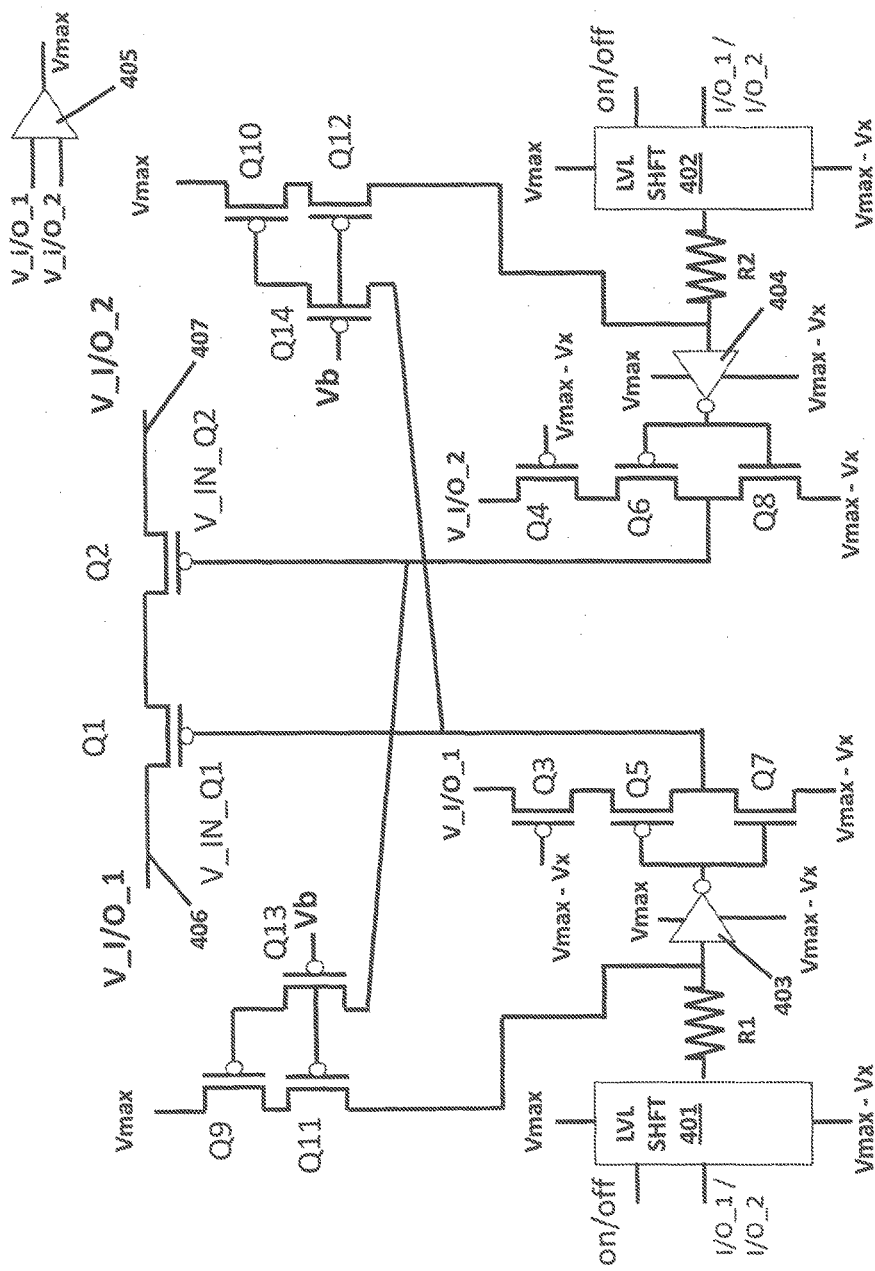
Figure 5:
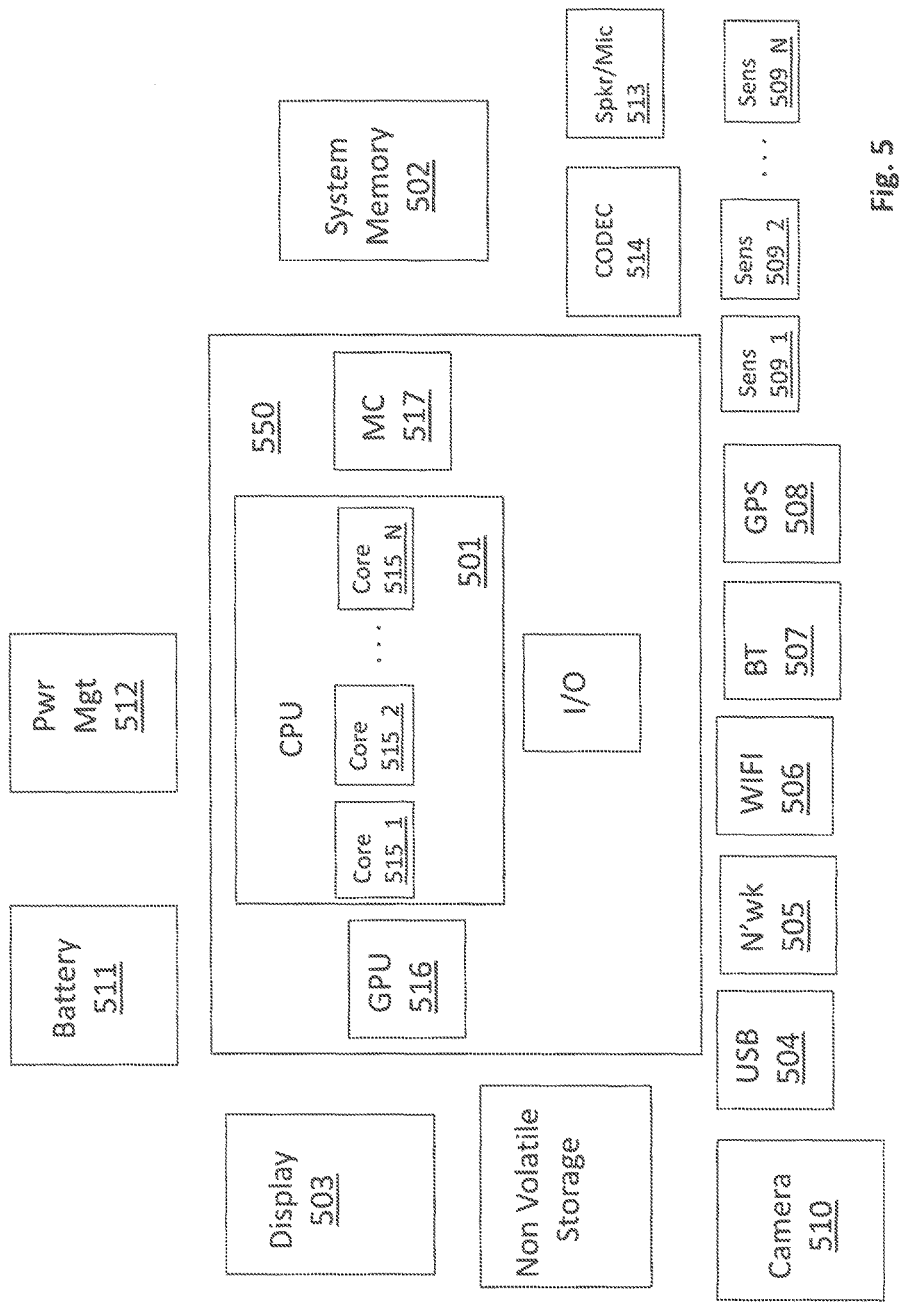

FIGS. 3a and 3b compare the problem with the prior art stacked switch circuit against the operation of an improved stacked switch circuit;

FIG. 4 shows an embodiment of an improved stacked switch circuit;

FIG. 5 shows a computing system.

DETAILED DESCRIPTION

Figure 1A:
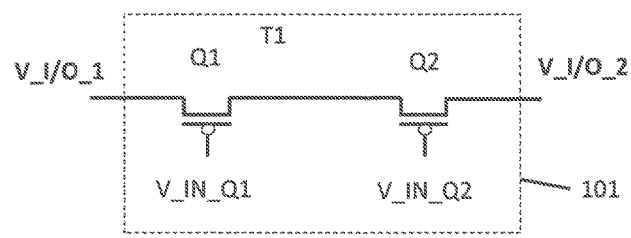
FIGS. 1a, 1b and 1c show a prior art stacked switch circuit.

FIG. 1a shows a basic embodiment of a "stacked" bi-directional switch 101. As observed in FIG. 1a, a stacked bi-directional switch 101 includes first and second transistors Q1 and Q2 where both of the transistors Q1 and Q2 have a lower voltage rating than the switch as a whole and their combined respective voltage ratings corresponds to the voltage rating of the switch as a whole. For example, if both of transistors Q1 and Q2 have a +/−2.5V maximum drain-source voltage rating, the bi-directional switch may be rated as a +/−5 V maximum switch. That is, |(V_I/O_1)−(V_I/O_2)|≤5V. effectively defines the operational range of the switch.

When the switch is "on", a low voltage is applied to the gate of both of p type transistors Q1 and Q2. If V_I/O_1 is higher than V_I/O_2, current flows from the V_I/O_1 node to the V_I/O_2 node through transistors Q1 and Q2 in series. Contrawise, if V_I/O_2 is higher than V_I/O_1, current flows from the V_I/O_2 node to the V_I/O_1 node through transistors Q2 and Q1 in series. Here, both of the V_I/O_1 and V_I/O_2 nodes may be coupled to a different respective pin-out of a semiconductor chip. In this case, both the V_I/O_1 and V_I/O_2 voltages are external voltages that are generated off-chip and respectively received by the bi-directional switch at opposite ends of the Q1 and Q2 transistors as depicted in FIG. 1a.

Figure 1B:
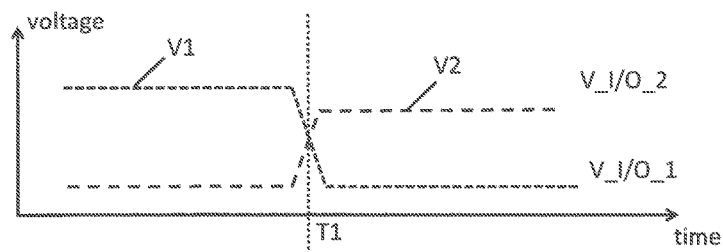
Figure 1C:
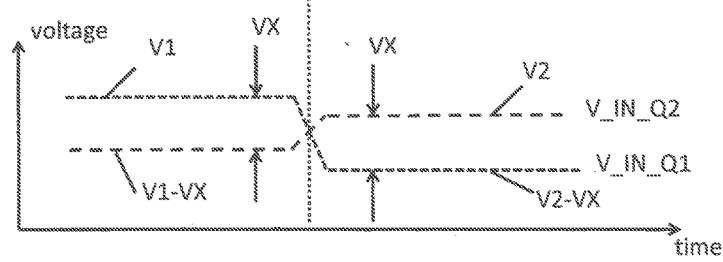

In various embodiments, as observed in FIGS. 1b and 1c, the gate voltages of transistors Q1 and Q2 are specially created when the switch is turned "off". Here, FIG. 1b shows a simplistic example of possible external V_I/O_1 and V_I/O_2 voltages that the switch may be subjected to while it is "off". As observed in FIG. 1b, prior to time T1, V_I/O_1 is greater than V_I/O_2, whereas, after time T1, V_I/O_1 is less than V_I/O_2.

FIG. 1c shows the manipulation of the gate voltage of transistors Q1 and Q2 in response to the changing of the external voltages V_I/O_1 and V_I/O_2. As can be seen in FIG. 1c, prior to time T1, the larger of V_I/O_1 and V_I/O_2 is V_I/O_1 which has a voltage level of V1. As such, the gate on Q1 is set to V1 and the gate on Q2 is set to V1−X. That is, the gate of the transistor on the side of the switch that receives the larger external voltage (Q1) is set to the larger external voltage (V1). The gate of the transistor on the side of the switch that receives the lesser external voltage (Q2) is set to the larger external voltage less some offset voltage VX (i.e., the gate of transistor Q2 is set to V1−VX).

The same approach is observed after time T2. After time T2, the larger of V_I/O_1 and V_I/O_2 is V_I/O_2 which has a voltage of V2. As such, the gate of the transistor on the side of the switch that receives the larger external voltage (Q2) is set to the larger of the external voltages (V2), and, the gate of the transistor on the side of the switch that receives the lesser external voltage (Q1) is set to the larger external voltage less some offset voltage VX (i.e., the gate of transistor Q1 is set to V2−VX).

Here, VX ensures that the gate voltage of the transistor on the side of the switch that receives the lesser external voltage does not exceed the rating for the transistor. In an embodiment, VX is half of the full rating of the switch, or, the rating of one of transistors Q1 and Q2. For example, recalling the aforementioned example in which the rating of both transistors is 2.5V and the rating of the overall switch is 5V, in the same embodiment, VX may be set to 2.5V.

As such, if a worst case voltage difference is applied across the ends of the switch, the transistor on the higher end will receive 5V at its source/drain node and 5V at its gate node, and the transistor on the lower end will receive 0V at its source/drain node and 2.5V at its gate node. Here, the transistor on the higher end is clearly off which turns the switch off and the transistor on the lower end only observes its maximum gate to source/drain rated voltage (i.e., (gate=2.5V)−(gate/source=0V)).

Also, importantly, note that the normal bias of the switch in the "off" state includes one of the transistors being "off" but another one of the transistors may be "on". Specifically, the transistor on the side of the switch that receives the larger external I/O voltage is in the "off" state. The transistor on the other side of the switch (i.e., transistor that receives the lesser of the external I/O voltages), however, may be "on" or nearly "on". For example, if the lesser external I/O voltage is only slightly less than higher external I/O voltage.

Figure 2A:
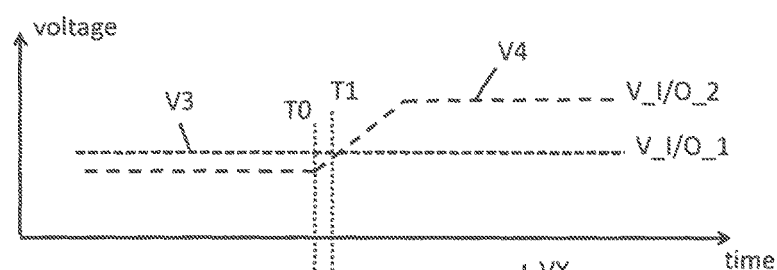
FIGS. 2a, 2b and 2c show a problem with the prior art stacked switch circuit of FIGS. 1a, 1b and 1c.
Figure 2B:
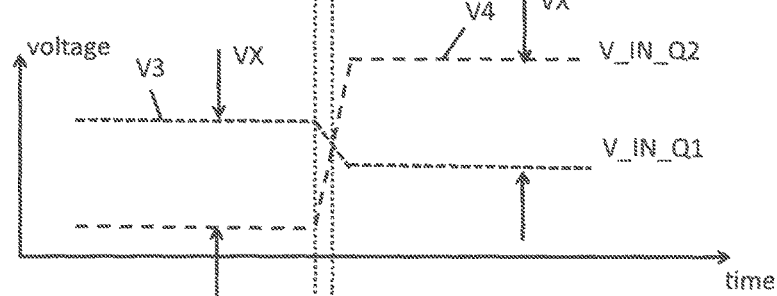
Figure 2C:
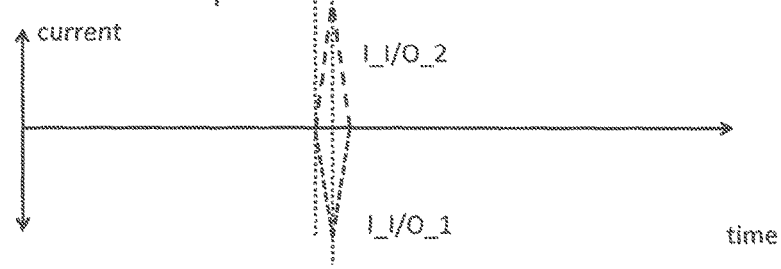

In this case, where one of the transistors in the switch is on while the switch as a whole is supposed to be off, a problem can arise. FIGS. 2a through 2c explore the problem in more detail. To better illustrate the problem, the external V_I/O_1 and V_I/O_2 voltages of FIG. 2a are different than the external voltages of FIG. 1b. In particular, as observed in FIG. 2a, prior to time T0, V_I/O_1 remains constant at a voltage level of V3 while V_I/O_2 lies only slightly beneath it. In this state, Q1 is "off" but Q2 is "on". Here, the drain/source voltage of Q2 is only slight less than V3 but its gate voltage is well beneath V3 (being V3−VX).

After time T0, the voltage on V_I/O_2 rises to a new voltage level V4 that is higher than V3. Referring to FIG. 2b, just after time T0, the gate voltage on transistor Q1 (V_IN_Q1) begins to lower which begins to transition Q1 into a quasi-on state or a full-on state. Meanwhile, the gate voltage on transistor Q2 (V_IN_Q2) has not risen high enough to completely turn transistor Q2 off.

As such, both of transistors Q1 and Q2 are not fully off resulting in a transient "on" state of the switch when the switch is supposed to remain completely off. The transient "on" state is observed in FIG. 2c. Here, a "shoot-through" current is observed to flow from the Q2 end of the switch through transistors Q2 and Q1 to the Q1 end of the switch (current that flows into the switch has a positive polarity and current that flows out of the switch has a negative polarity).

FIGS. 3a and 3b show a solution to the aforementioned problem. FIG. 3a reshows the same Q1 and Q2 gate voltage waveforms of FIG. 2b that were associated with a circuit that exhibits the shoot-through current problem. By contrast, FIG. 3b shows the Q1 and Q2 gate voltage waveforms for an improved circuit that eliminates the problem by ensuring that the transistor that is supposed to be off with the new external voltage levels is off before the transistor that was off with the prior external voltage levels and may be on with the new external voltage levels can begin to turn on.

Specifically, before T0, transistor Q1 is off and transistor Q2 is on, whereas, after T2, transistor Q2 is off and transistor Q1 is on. Here, in the improved approach of FIG. 3b, transistor Q1 is ensured to remain off before transistor Q2 turns on because the change in gate voltage to Q1 is effectively delayed relative to the change in gate voltage to Q2. Comparing FIGS. 3a and 3b, note that the fall of the gate voltage to transistor Q1 in FIG. 3b occurs noticeably later than the fall in FIG. 3a.

FIG. 4 shows an embodiment of a circuit that is designed to operate consistently with the operation described above with respect to FIG. 3b. In the circuit of FIG. 4, a maximum voltage selection circuit 405 is provided with both of the external voltages V_I/O_1, V_I/O_2 and presents the higher of the two on its output node which is labeled Vmax. The Vmax node is coupled to a pair of level shifters 401, 402 as their higher voltage level. The lower voltage level of the level shifters is Vmax-VX where, as described above, VX may be a bias voltage that is midway between the voltage rating of the switch as a whole and/or the voltage rating of either of transistors Q1 and Q2.

When the switch is "off" and an open circuit is to be imposed between the two external nodes 406, 407 by turning at least one of transistors Q1 and Q2 off. Here, an "OFF" signal ("on/off"="off") is applied to both of level shifters 401, 402. Both of level shifters 401, 402 also receive a signal that indicates which of external nodes 406, 407 has the higher voltage (i.e., the "I/O_1/I/O_2" input signal indicates which of V_I/O_1 and V_I/O_2 is larger). Here, the I/O_1/I/)_2 signal can be provided by the maximum selection circuit 405 as it is cognizant of which external voltage is larger in order to select the higher of the two voltages.

In the case where V_I/O_1 is greater than V_I/O_2 and the switch is to be open (on/off="OFF"), level shifter 401 provides the higher of its voltage rail voltages at its output because level shifter 401 is on the side of the circuit having the larger external voltage (V_I/O_1). The voltage rails of the level shifter include Vmax as its higher rail voltage and Vmax-VX as its lower rail voltage. As such, level shifter 401 will provide Vmax at its output which provided to the input of inverter 403 which has the same voltage rail setup as level shifter 401. Because inverter 403 is essentially provided a logic high input voltage (Vmax) relative its power rail setup, inverter 403 will provide its lower rail voltage Vmax-VX at its output.

The Vmax-VX output voltage from inverter 403 is provided to transistor arrangement Q3, Q5, Q7. With Vmax-VX being provided to the transistor arrangement, transistors Q3 and Q5 will be on and transistor Q7 will be off. As such, a voltage of V_I/O_1 will flow through transistors Q3 and Q5 to the base of transistor Q1. As such, V_IN_Q1 is set to Vmax which, in turn, corresponds to V_I/O_1.

By contrast, again continuing with the example where V_I/O_1 is greater than V_I/O_2, level shifter 402 will select the lesser of its rail voltages, Vmax-VX, because it is on the side of the circuit having the smaller external voltage (V_I/O_2). As such, a logic low voltage of Vmax-Vx will be provided to inverter 404 which will provide a logic high voltage Vmax at its output in response. In response to the logic high Vmax voltage being provided at the output of inverter 404, transistors Q4 and Q6 will be off and transistor Q8 will be on. As such, a voltage of Vmax-VX will be provided to the gate of transistor Q2 (i.e., V_IN_Q2=Vmax-VX).

The two sides of the circuit will operate opposite to that described above in the case where V_I/O_2 is greater than V_I/O_1. Thus, as between transistors 01 and Q2 when the switch is "OFF", the transistor that receives the higher external voltage will receive a gate voltage of Vmax (which keeps that transistor OFF) and the transistor that receives the lesser external voltage will receive a gate voltage of Vmax-VX which protects the transistor against a worst case voltage but may also keep the transistor on depending on the external voltage it receives.

In the case where the switch is "ON" both of transistors Q1 and Q2 are "on" which can be effected by causing both of transistors Q1, Q2 to receive a gate voltage of Vmax-Vx. Both of transistors Q1 and Q2 can be made to receive a gate voltage of Vmax-Vx by designing the level shifters 401, 402 to provide Vmax-Vx at their respective outputs in response to the on/off signal being "ON". With Vmax-Vx being provided at the respective outputs of both level shifters 401, 402, both of inverters 403, 404 will provide a logic high voltage Vmax at their respective outputs. In response, transistors Q3 through Q6 will be off and transistors Q7 and Q8 will be on which provides Vmax-VX and the gate of both of transistors Q1 and Q2.

Returning to the case then when the switch is to be OFF, in the situation where the external voltages toggle as between which one is larger and which one is smaller, recall that a shoot through current problem can arise. However, in order to prevent this problem, as discussed with respect to FIG. 3b, the circuit of FIG. 4 keeps whichever of transistors Q1 and Q2 that was receiving the higher voltage and therefore was off before the toggle remains off until the other of transistors Q1 and Q2 is assuredly off and receiving the higher voltage at its gate after the toggle.

Here, transistor network Q9 through Q14 provides this particular feature. Consider a situation where V_I/O_1 is originally higher than V_I/O_2 and then suddenly V_I/O_2 becomes larger than V_I/O_1. Initially, when V_I/O_1 is higher than V_I/O_2, as discussed at length above, the gate of Q1 will be set at Vmax=V_I/O_1 and the gate of Q2 will be set at Vmax-VX. In this state, transistors Q10 and Q12 will be "off" because the Vmax voltage level that is applied to the gate of transistor Q1 will be received by and flow through transistor Q14. By contrast, transistors Q9 and Q11 will be "on" because Vmax-VX will be received by and will flow through transistor Q13.

With Q9 and Q11 being on, the input to inverter 403 will be hard driven to a value of Vmax by the additional driving provide by transistors Q9 and Q11. Here, resistor R1 reduces the ability of the level shifter 401 to drive inverter 401 so that transistors Q9 and Q11 primarily drive inverter 401 once the circuit is in a steady state. The input to inventor 404, however, will not receive any hard additional driving because transistors Q10 and Q12 are off.

When V_I/O_2 suddenly becomes larger than V_I/O_1, the circuit as a whole will attempt to flip in that the opposite sides of the circuit will try to operate as their opposing counterpart did prior to the sudden change in external voltage. However, whereas the side of the circuit that was receiving the lesser external voltage prior to the change (the right side in FIG. 4 in the present example) is free to immediately flip because transistors Q10 and Q12 are off and are not hard driving from the state of the circuit as it existed prior to the change, by contrast, the side of the circuit that was receiving the larger external voltage prior to the change (the left side in FIG. 4 in the present example) is not free to immediately flip because transistors Q9 and Q11 are on and are hard driving from the state of the circuit as it existed prior to the change.

Said a better way, the gate voltage on transistor Q1 does not change from Vmax to Vmax−VX until transistors Q9 and Q11 turn off which can not happen until a gate voltage of Vmax is applied to transistor Q2. However, once a gate voltage of Vmax is applied to transistor Q2, transistor Q2 will be off. Thus, transistor Q1 will remain off until transistor Q2 is turned off. Thus shoot through current is prevented because at least one of transistors Q1 and Q2 remains off during the switch from a higher V_I/O_1 state to a higher V_I/O_2 state.

In the case where V_I/O_2 is initially higher and then V_I/O_1 is suddenly higher, the two sides of the circuit behave opposite to that described just above.

In various embodiments, Q9 and Q10 are thin oxide devices to provide them a larger channel capacitance, which, in turn, slows down their switching ability. This will have the effect of keeping the initially off transistor off for a longer period of time than if the devices were not thin oxide devices.

FIG. 5 shows a depiction of an exemplary computing system 500 such as a personal computing system (e.g., desktop or laptop) or a mobile or handheld computing system such as a tablet device or smartphone, or, a larger computing system such as a server computing system. As observed in FIG. 5, the basic computing system may include a central processing unit 501 (which may include, e.g., a plurality of general purpose processing cores and a main memory controller disposed on an applications processor or multi-core processor), system memory 502, a display 503 (e.g., touchscreen, flat-panel), a local wired point-to-point link (e.g., USB) interface 504, various network I/O functions 505 (such as an Ethernet interface and/or cellular modem subsystem), a wireless local area network (e.g., WiFi) interface 506, a wireless point-to-point link (e.g., Bluetooth) interface 507 and a Global Positioning System interface 508, various sensors 509_1 through 509_N (e.g., one or more of a gyroscope, an accelerometer, a magnetometer, a temperature sensor, a pressure sensor, a humidity sensor, etc.), a camera 510, a battery 511, a power management control unit 512, a speaker and microphone 513 and an audio coder/decoder 514.

An applications processor or multi-core processor 550 may include one or more general purpose processing cores 515 within its CPU 501, one or more graphical processing units 516, a memory management function 517 (e.g., a memory controller) and an I/O control function 518. The general purpose processing cores 515 typically execute the operating system and application software of the computing system. The graphics processing units 516 typically execute graphics intensive functions to, e.g., generate graphics information that is presented on the display 503. The memory control function 517 interfaces with the system memory 502.

Each of the touchscreen display 503, the communication interfaces 504-507, the GPS interface 508, the sensors 509, the camera 510, and the speaker/microphone codec 513, 514 all can be viewed as various forms of I/O (input and/or output) relative to the overall computing system including, where appropriate, an integrated peripheral device as well (e.g., the camera 510). Depending on implementation, various ones of these I/O components may be integrated on the applications processor/multi-core processor 550 or may be located off the die or outside the package of the applications processor/multi-core processor 550.

The aforementioned switch circuit may be integrated into various ones of the different computing system components described above, such as being integrated within a semiconductor chip. The specific circuitry that the switch is integrated into may be logic circuitry implemented as any of an application specific integrated circuit (ASIC), a programmable logic device (PLD) circuit, or a field programmable gate array (FPGA) circuit, where, the aforementioned switch circuit is coupled to or within circuitry that provides power to the logic circuitry.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a stacked bi-directional switch circuit having protection circuitry to prevent shoot through current when the switch is in an off state and respective voltages at the input/output terminals of the switch change such that before the change one of the input/output terminals of the switch has the higher voltage and after the change the other input/output terminal of the switch has the higher voltage, the protection circuitry to, during the change, keep a first of the transistors in the switch's current path that was off prior to the change off at least until a second of the transistors in the switch's current path is turned off in response to the change, an isolated internal node of the bi-directional switch circuit that resides along the current path being coupled to a first respective channel end of both the first and second transistors, a first of the input/output terminals coupled to a second respective channel end of the first transistor, a second of the input/output terminals coupled to a second respective channel end of the second transistor, the isolated internal node not being coupled to any nodes other than the first respective channel end of both the first and second transistors, the switch's current path flowing through the respective channels of both the first and second transistors.

2. The apparatus of claim 1 wherein when the stacked bi-directional switch circuit is in the off state the protection circuitry keeps off a transistor in the switch's current path that was off in a first steady state when the one terminal of the switch had the higher voltage until another transistor that will be off in a second steady state when the other terminal of the switch has the higher voltage.

3. The apparatus of claim 1 wherein the stacked bi-directional switch circuit comprises circuitry to, when the stacked bi-directional switch circuit is in the off state, apply a higher of the respective voltages at the terminals of the switch to a gate of a transistor in the switch's current path at the terminal of the switch that receives the higher of the respective voltages.

4. The apparatus of claim 3 wherein the stacked bi-directional switch circuit comprises circuitry to, when the stacked bi-directional switch circuit is in the off state, apply the higher of the respective voltages less a second voltage to a gate of another transistor in the switch's current path that receives a lesser of the respective voltages at the terminals of the switch.

5. The apparatus of claim 4 wherein application of the higher of the respective voltages less the second voltage to the gate of the another transistor prevents the other transistor from exceeding a maximum rating.

6. The computing system of claim 1 wherein the terminals are respectively coupled to first and second I/Os of a semiconductor chip that the stacked bi-directional switch is integrated within.

7. An apparatus, comprising:
a stacked bi-directional switch circuit having protection circuitry to prevent shoot through current when the switch is in an off state and respective voltages at the input/output terminals of the switch change such that before the change one of the input/output terminals of the switch has the higher voltage and after the change the other input/output terminal of the switch has the higher voltage, wherein, the stacked bi-directional switch circuit has first and second halves that mirror each other and the protection circuitry couples the first and second halves, the protection circuitry to, during the change, keep a first of the transistors in the switch's current path that was off prior to the change off at least until a second of the transistors in the switch's current path is turned off in response to the change, an isolated internal node of the bi-directional switch circuit that resides along the current path being coupled to a first respective channel end of both the first and second transistors, a first of the input/output terminals coupled to a second respective channel end of the first transistor, a second of the input/output terminals coupled to a second respective channel end of the second transistor, the isolated internal node not being coupled to any nodes other than the first respective channel end of both the first and second transistors, the switch's current path flowing through the respective channels of both the first and second transistors.

8. The apparatus of claim 7 wherein when the stacked bi-directional switch circuit is in the off state the protection circuitry keeps off a transistor in the switch's current path that was off in a first steady state when the one terminal of the switch had the higher voltage until another transistor that will be off in a second steady state when the other terminal of the switch has the higher voltage.

9. The apparatus of claim 7 wherein the stacked bi-directional switch circuit comprises circuitry to, when the stacked switch circuit is in the off state, apply a higher of the respective voltages at the terminals of the switch to a gate of a transistor in the switch's current path at the terminal of the switch that receives the higher of the respective voltages.

10. The apparatus of claim 9 wherein the stacked bi-directional switch circuit comprises circuitry to, when the stacked bi-directional switch circuit is in the off state, apply the higher of the respective voltages less a second voltage to a gate of another transistor in the switch's current path that receives a lesser of the respective voltages at the terminals of the switch.

11. The apparatus of claim 10 wherein application of the higher of the respective voltages less the second voltage to the gate of the another transistor prevents the other transistor from exceeding a maximum rating.

12. The computing system of claim 7 wherein the terminals are respectively coupled to first and second I/Os of a semiconductor chip that the stacked bi-directional switch is integrated within.

13. A computing system, comprising:
one or more processing cores;
a system memory;
a memory controller coupled to the system memory;
power supply circuitry, the power supply circuitry comprising a stacked bi-directional switch circuit having protection circuitry to prevent shoot through current when the switch is in an off state and respective voltages at the input/output terminals of the switch change such that before the change one of the input/output terminals of the switch has the higher voltage and after the change the other input/output terminal of the switch has the higher voltage, the protection circuitry to, during the change, keep a first of the transistors in the switch's current path that was off prior to the change off at least until a second of the transistors in the switch's current path is turned off in response to the change, an isolated internal node of the bi-directional switch circuit that resides along the current path being coupled to a first respective channel end of both the first and second transistors, a first of the input/output terminals coupled to a second respective channel end of the first transistor, a second of the input/output terminals coupled to a second respective channel end of the second transistor, the isolated internal node not being coupled to any nodes other than the first respective channel end of both the first and second transistors, the switch's current path flowing through the respective channels of both the first and second transistors.

14. The computing system of claim 13 wherein when the stacked bi-directional switch circuit is in the off state the protection circuitry keeps off a transistor in the switch's current path that was off in a first steady state when the one terminal of the switch had the higher voltage until another transistor that will be off in a second steady state when the other terminal of the switch has the higher voltage.

15. The computing system of claim 13 wherein the stacked switch circuit comprises circuitry to, when the stacked bi-directional switch circuit is in the off state, apply a higher of the respective voltages at the terminals of the switch to a gate of a transistor in the switch's current path at the terminal of the switch that receives the higher of the respective voltages.

16. The computing system of claim 15 wherein the stacked bi-directional switch circuit comprises circuitry to, when the stacked bi-directional switch circuit is in the off state, apply the higher of the respective voltages less a second voltage to a gate of another transistor in the switch's current path that receives a lesser of the respective voltages at the terminals of the switch.

17. The computing system of claim 16 wherein application of the higher of the respective voltages less the second voltage to the gate of the another transistor prevents the other transistor from exceeding a maximum rating.

18. The computing system of claim 13 wherein the terminals are respectively coupled to first and second I/Os of a semiconductor chip that the stacked bi-directional switch is integrated within.

* * * * *